(12) United States Patent
Fujiwara et al.

(10) Patent No.: US 9,041,473 B2
(45) Date of Patent: May 26, 2015

(54) POWER AMPLIFIER

(71) Applicant: Mitsubishi Electric Corporation, Tokyo (JP)

(72) Inventors: Shigeru Fujiwara, Tokyo (JP); Kazuya Yamamoto, Tokyo (JP); Miyo Miyashita, Tokyo (JP); Shigeo Yamabe, Tokyo (JP); Daisuke Kobayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/164,331

(22) Filed: Jan. 27, 2014

(65) Prior Publication Data

US 2014/0306761 A1 Oct. 16, 2014

(30) Foreign Application Priority Data

Apr. 16, 2013 (JP) .................. 2013-085792

(51) Int. Cl.
*H03F 1/22* (2006.01)
*H03F 1/32* (2006.01)
*H03F 3/193* (2006.01)
*H03F 3/24* (2006.01)

(52) U.S. Cl.
CPC .............. *H03F 1/3205* (2013.01); *H03F 1/223* (2013.01); *H03F 3/193* (2013.01); *H03F 3/245* (2013.01); *H03F 2200/105* (2013.01); *H03F 2200/108* (2013.01); *H03F 2200/192* (2013.01); *H03F 2200/195* (2013.01); *H03F 2200/204* (2013.01); *H03F 2200/207* (2013.01); *H03F 2200/222* (2013.01); *H03F 2200/387* (2013.01); *H03F 2200/405* (2013.01); *H03F 2200/408* (2013.01); *H03F 2200/411* (2013.01); *H03F 2200/465* (2013.01)

(58) Field of Classification Search
CPC ......... H03F 3/193; H03F 1/223; H03F 3/211; H03F 3/245; H03F 3/195; H03F 3/68; H03F 3/72; H03F 3/45179; H03F 1/0205; H03F 3/602; H03F 1/523; H03F 2200/492; H03F 2203/7215; H03F 3/213; H03F 3/265; H03F 1/0261; H03F 1/0277; H03F 2200/451; H03F 2200/387; H03F 3/187; H03F 3/45192
USPC ......................................... 330/277, 311, 285
See application file for complete search history.

(56) References Cited

U.S. PATENT DOCUMENTS

| 2,943,267 | A | * | 6/1960 | Randise | 330/311 |
|---|---|---|---|---|---|
| RE32,132 | E | * | 4/1986 | Nakamura et al. | 360/65 |
| 6,864,750 | B2 | * | 3/2005 | Shigematsu | 330/311 |
| 7,242,253 | B2 | * | 7/2007 | Motta et al. | 330/311 |
| 2003/0011436 | A1 | | 1/2003 | Shigematsu | |
| 2009/0121791 | A1 | * | 5/2009 | Lu et al. | 330/311 |

FOREIGN PATENT DOCUMENTS

JP 5-308233 A 11/1993
JP 2003-92523 A 3/2003

* cited by examiner

*Primary Examiner* — Khanh V Nguyen
(74) *Attorney, Agent, or Firm* — Leydig, Voit & Mayer, Ltd.

(57) ABSTRACT

A power amplifier includes: first and second bias terminals to which bias voltages are respectively supplied; a first transistor having a first control terminal connected to the first bias terminal, a first terminal that is grounded, and a second terminal; a second transistor having a second control terminal connected to the second bias terminal, a third terminal connected to the second terminal, and a fourth terminal; a capacitor connected between the second control terminal and a grounding point; and a variable resistor connected in series with the capacitor, between the second control terminal and the grounding point.

6 Claims, 11 Drawing Sheets

US 9,041,473 B2

POWER AMPLIFIER

BACKGROUND OF THE INVENTION

1. Field of the Invention

The present invention relates mainly to a power amplifier in a portable telephone or the like for mobile communication.

2. Background Art

Radiofrequency power amplifiers for portable telephones in code division multiple access (CDMA) schemes or the like include ones using a complementary metal oxide semiconductor (CMOS) cascode amplifier for a reduction in manufacturing cost. The development of such power amplifiers is now being promoted. Variation in gain of a cascode amplifier with respect to input power is an AM-AM characteristic, while variation in phase is an AM-PM characteristic. There is a correlation between the AM-AM characteristic and a distortion characteristic. If the amount of AM-AM change can be reduced, the distortion characteristic can be improved.

A technique for adjusting a gain frequency characteristic S21 at 0 to 60 GHz (a frequency dependence of the gain with respect to constant input power) of a cascode amplifier, particularly the amount of leap in gain has been proposed (see, for example, Japanese Patent Laid-Open No. 2003-92523). This technique, however, is not a technique for adjusting an AM-AM characteristic (or an AM-PM characteristic) of a cascode amplifier.

SUMMARY OF THE INVENTION

Conventionally, adjustment of an AM-AM characteristic (and an AM-PM characteristic) of a cascode amplifier is performed through adjustment of the gate (base) bias and the drain (collector) bias of a transistor, the input power supply impedance and the output load impedance. With this adjustment, however, there is a problem that not only the AM-AM characteristic (and the AM-PM characteristic) but also characteristics that should not be changed, e.g., the idle current, the efficiency and the saturated output power are changed.

In view of the above-described problems, an object of the present invention is to provide a power amplifier that can adjust the AM-AM characteristic without changing other characteristics including the idle current.

According to the present invention, a power amplifier includes: first and second bias terminals to which bias voltages are respectively supplied; a first transistor having a first control terminal connected to the first bias terminal, a first terminal grounded, and a second terminal; a second transistor having a second control terminal connected to the second bias terminal, a third terminal connected to the second terminal, and a fourth terminal; a capacitor connected between the second control terminal and a grounding point; and a variable resistor connected in series with the capacitor between the second control terminal and the grounding point.

The present invention makes it possible to adjust the AM-AM characteristic without changing other characteristics including the idle current.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
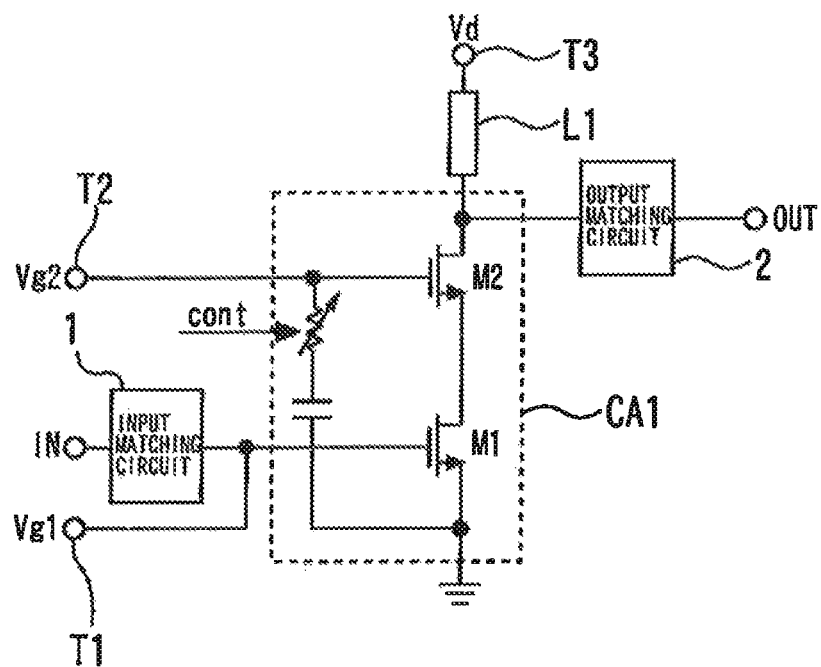
FIG. 1 is a circuit diagram showing a cascode amplifier according to a first embodiment of the present invention.

FIG. 1 is a circuit diagram showing a cascode amplifier according to a first embodiment of the present invention. Transistors M1 and M2 are n-channel MOS transistors. An RF input signal is applied to an input terminal N. An RF output signal is output from an output terminal OUT. Bias voltages Vg1 and Vg2 are respectively supplied to bias terminals T1 and T2. A power supply terminal T3 is connected to a power supply.

The gate of the transistor M1 is connected to the input terminal IN through an input matching circuit 1 and is also connected to the bias terminal T1. The source of the transistor M1 is grounded. Accordingly, the transistor M1 forms a source-grounded amplifier. The transistor M2 has its gate connected to the bias terminal T2 and its source connected to the drain of the transistor M1. The drain of the transistor M2 is connected to the power supply terminal T3 through a feed line L1 and is also connected to the output terminal OUT through an output matching circuit 2. The feed line L1 is a line having a particular electrical length and functioning as an inductor. A fixed capacitor C1 and a variable resistor Rv1 are connected in series between the gate of the transistor M2 and a grounding point. Accordingly, the transistor M2 forms a gate-grounded amplifier having the gate grounded with respect to radiofrequencies through the fixed capacitor C1 and the variable resistor Rv1. The transistor M1 and the transistor M2 are connected to each other in a cascading manner. The transistors M1 and M2, the fixed capacitor C1 and the variable resistor Rv1 constitute a cascode amplifier CA1 (in the region indicated by the dotted line in FIG. 1).

Figure 2:
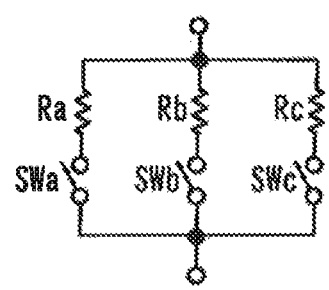
FIG. 2 is a circuit diagram showing the variable resistor according to the first embodiment of the present invention.

FIG. 2 is a circuit diagram showing the variable resistor according to the first embodiment of the present invention.

Fixed resistors Ra, Rb, and Rc are connected in parallel with each other and switches SWa, SWb, and SWc are connected in series to the resistors Ra, Rb, and Rc, respectively. The resistance value can be adjusted by switching of the switches SWa, SWb, and SWc.

Figure 3:
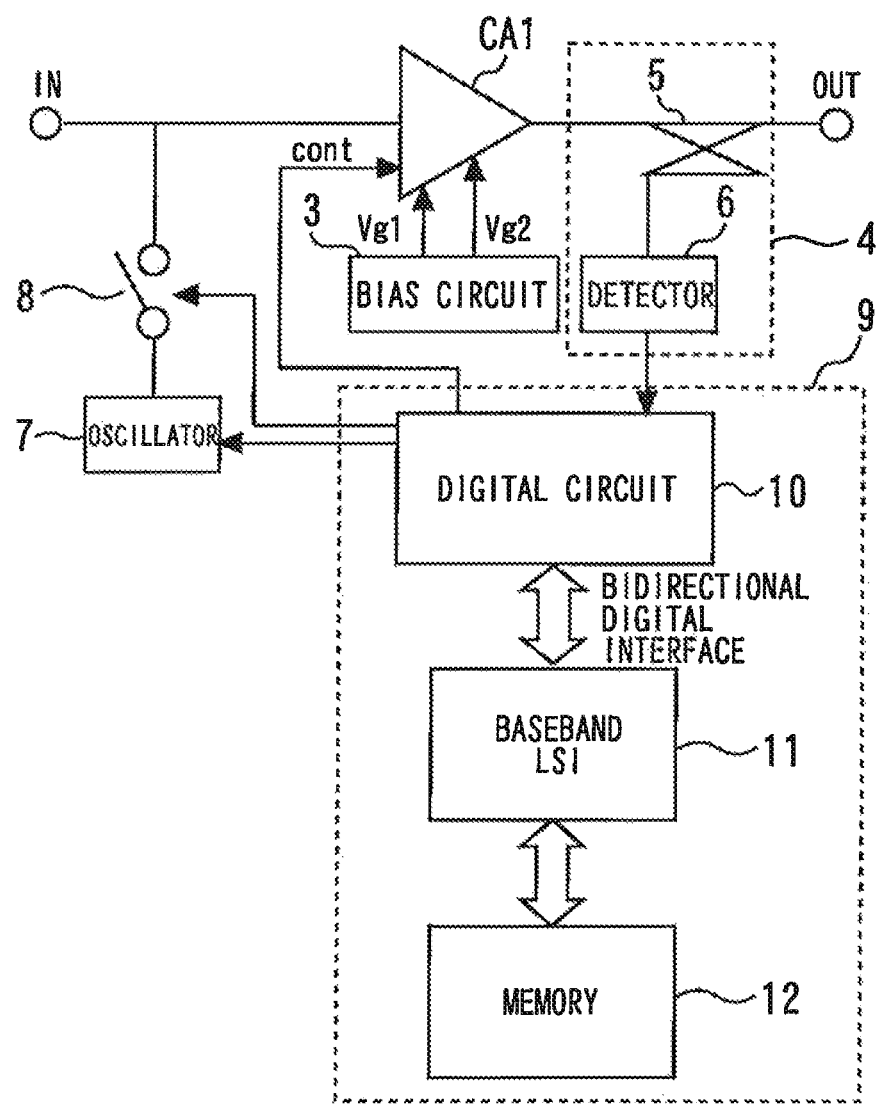
FIG. 3 is a circuit diagram showing a power amplifier according to the first embodiment of the present invention.

FIG. 3 is a circuit diagram showing a power amplifier according to the first embodiment of the present invention. A bias circuit 3 supplies biases Vg1 and Vg2 to the bias terminals T1 and T2, respectively. An output power sensing circuit 4 has a directional coupler 5 provided in an output line from the power amplifier, and a detector 6 connected to the directional coupler 5. The output power sensing circuit 4 senses the power of a signal output from the cascode amplifier CA1 and converts the sensed power into an electrical signal.

An oscillator 7 is connected to the input of the cascode amplifier CA1 via a switch 8. The oscillator 7 and the switch 8 constitute a built-in self test (BIST) circuit. A digital circuit 10 in a control circuit 9 turns on the switch 8 to start the oscillator 7, thereby causing the oscillator 7 to generate a test signal having known several points of input power and input the test signal to the cascode amplifier CA1. The output power sensing circuit 4 senses the electric power of the output signal from the cascode amplifier CA1. The digital circuit 10 obtains an initial AM-AM characteristic of the power amplifier based on the known several points of input power and the sensed output power (difference in gain among different several points ($\Delta$Gain)).

The digital circuit 10 transmits the obtained initial AM-AM characteristic to a baseband LSI 11 through a digital interface. The baseband LSI 11 compares a desired AM-AM characteristic held therein as a set value in advance and the initial AM-AM characteristic obtained by the digital circuit 10 to output a $\Delta$Gain increment/decrement signal to the digital circuit 10 through the digital interface. A memory 12 holds information necessary for setting to a desired variable resistor value. The digital circuit 10 determines a control voltage cont for control of the variable resistor Rv1 so that the AM-AM characteristic of the cascode amplifier CA1 becomes equal to the desired characteristic, and controls the resistance value of the variable resistor Rv1.

Figure 4:
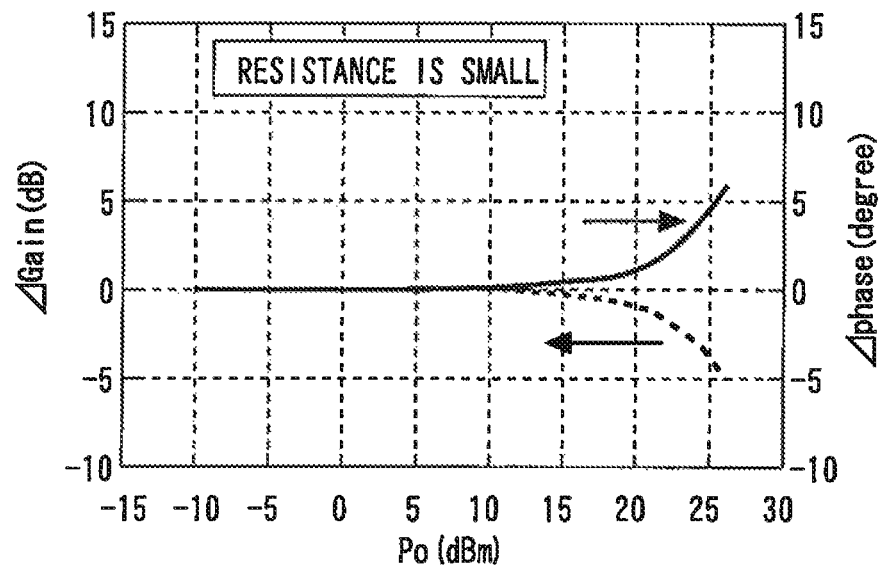
FIG. 4 is a diagram showing the relationship between the resistance value of the variable resistor and the AM-AM characteristic (ΔGain) and an AM-PM characteristic (ΔPhase) of the cascode amplifier.
Figure 4:
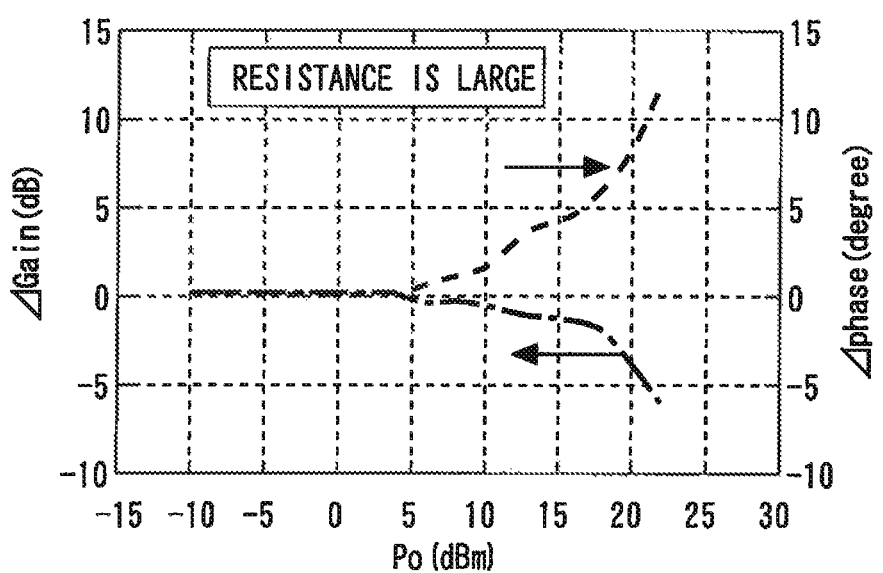

FIG. 4 is a diagram showing the relationship between the resistance value of the variable resistor and the AM-AM characteristic ($\Delta$Gain) and an AM-PM characteristic ($\Delta$Phase) of the cascode amplifier. As the resistance value of the variable resistor Rv1 is increased, the absolute values of $\Delta$Gain and $\Delta$Phase are increased. This relationship is utilized to enable adjusting the AM-AM characteristic and the AM-PM characteristic of the power amplifier by changing the resistance value of the variable resistor Rv1 through voltage control, for example.

Figure 5:
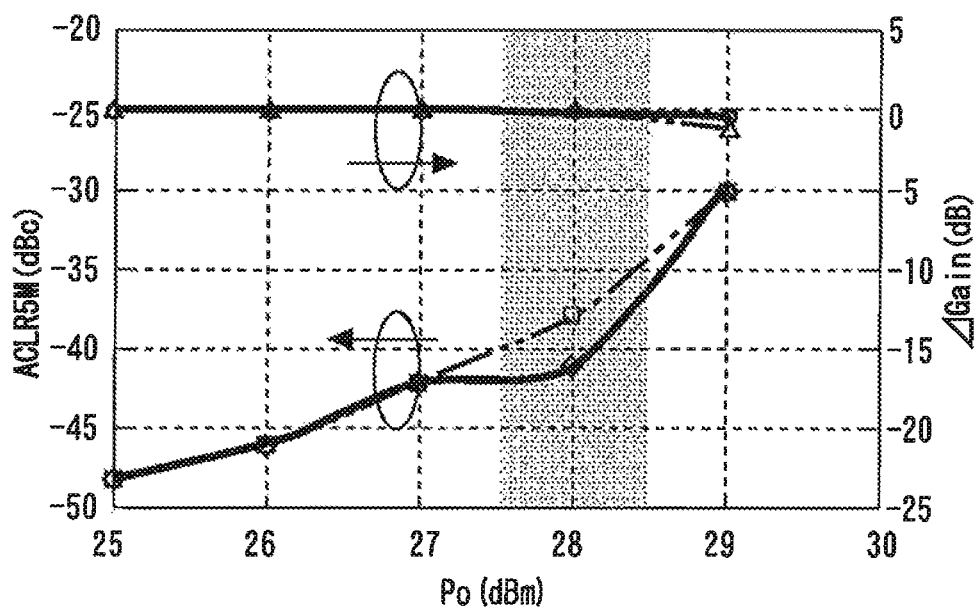
FIG. 5 is a diagram showing the relationship between the AM-AM characteristic (ΔGain) and a distortion characteristic (ACLR5M).

FIG. 5 is a diagram showing the relationship between the AM-AM characteristic ($\Delta$Gain) and a distortion characteristic (ACLR5M). There is a correlation between the AM-AM characteristic and the distortion characteristic. If the amount of AM-AM change can be reduced, the distortion characteristic can be improved.

In the present embodiment, the resistance value of the variable resistor Rv1 is controlled so that the AM-AM characteristic of the cascode amplifier CA1 changes from the initial state into the desired characteristic. In this way, the desired AM-AM characteristic can be obtained without changing other characteristics including the operating class and the idle current of the transistor when the power amplifier operates. As a result, distortions and variations due to manufacturing variations of active and passive elements in the power amplifier can be suppressed.

The power amplifier may be of a multistage construction. In this specification, however, amplifiers having no AM-AM characteristic adjustment function are omitted. In the present embodiment, for ease of detection, only the AM-AM characteristic is detected and adjusted. However, the AM-PM characteristic may also be detected and adjusted.

Second Embodiment

Figure 6:
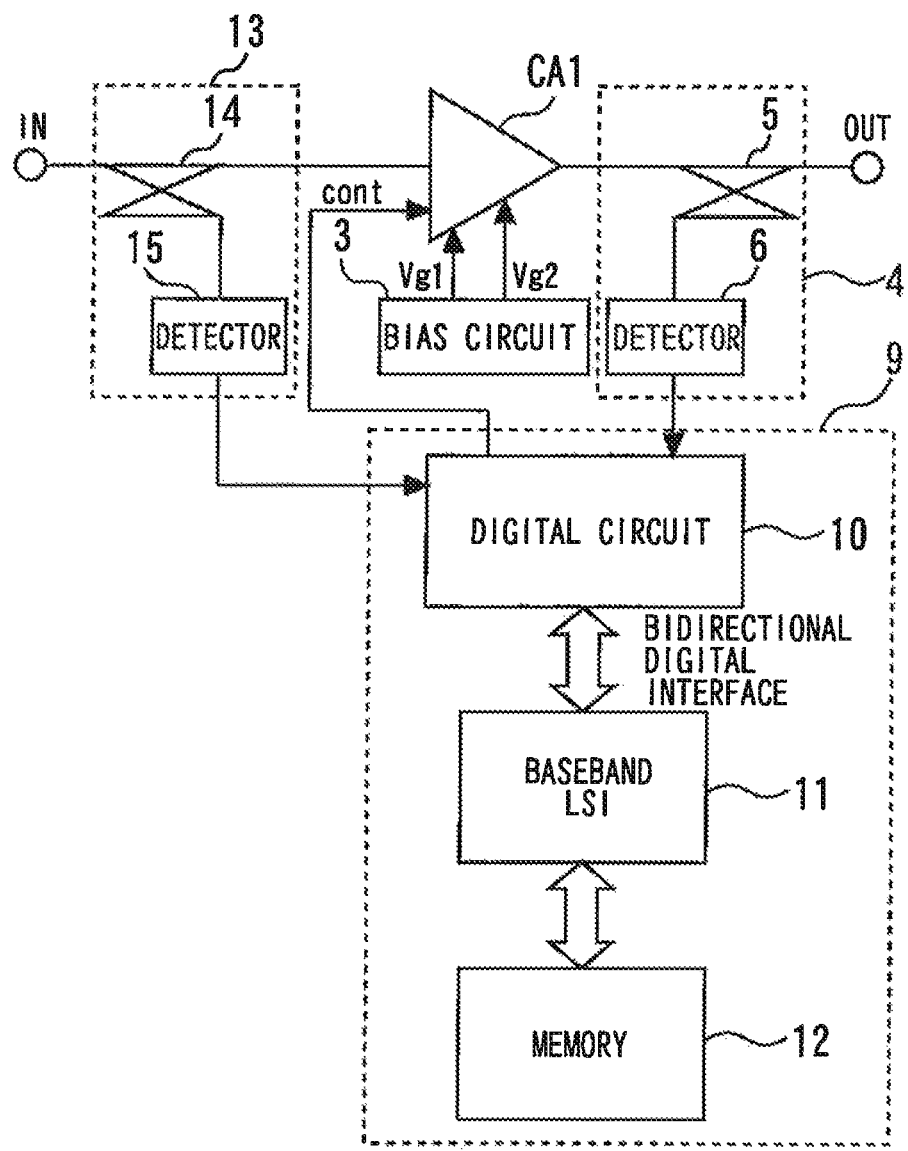
FIG. 6 is a circuit diagram showing a power amplifier according to a second embodiment of the present invention.

FIG. 6 is a circuit diagram showing a power amplifier according to a second embodiment of the present invention. An input power sensing circuit 13 is provided in place of the oscillator 7 and the switch 8 in the first embodiment. The input power sensing circuit 13 has a directional coupler 14 provided in an input line to the power amplifier, and a detector 15 connected to the directional coupler 14. The input power sensing circuit 13 senses the power of a signal input to the cascode amplifier CA1.

The control circuit 9 obtains the AM-AM characteristic ($\Delta$Gain) from the power of the input signal and the power of the output signal and controls the resistance value of the variable resistor Rv1 so that the obtained AM-AM characteristic becomes equal to the desired characteristic in an arbitrary operating state. The "arbitrary operating state" includes, for example, a frequency dependence, an output load impedance dependence and a Vc dependence. The AM-AM characteristic ($\Delta$Gain) changes depending on the values of these dependences.

An output load impedance dependence in such dependences will be described. In a mobile terminal such as a portable telephone, the impedance of the antenna changes depending on circumstances under which the mobile terminal is used. Conventionally, since an isolator is provided in the path from the output terminal of the transmitting power amplifier to the antenna, the output load impedance on the transmitting power amplifier is fixed at a predetermined impedance (e.g., 50$\Omega$) even when the impedance of the antenna is changed. In mobile terminals provided in recent years, however, the isolator is not disposed because of their small-size and low-cost design, so that the output load impedance on the transmitting power amplifier changes with change in antenna impedance.

Figure 7:
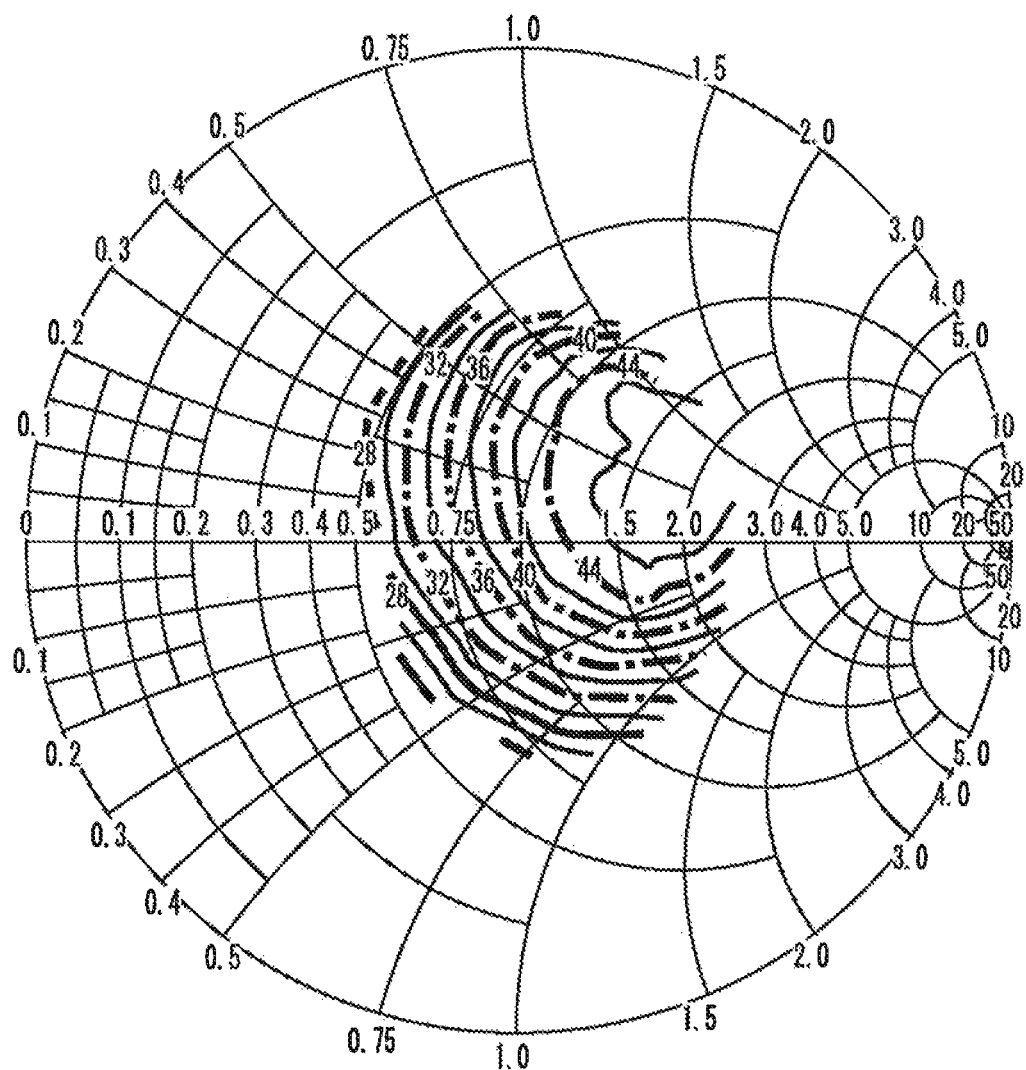
FIG. 7 is a diagram showing a load dependence of a distortion characteristic (ACLR) of the power amplifier according to the second embodiment of the present invention.

FIG. 7 is a diagram showing a load dependence of a distortion characteristic (ACLR) of the power amplifier according to the second embodiment of the present invention. It can be understood that when the output load impedance is changed, the distortion characteristic (ACLR) is changed. In the present embodiment, the amount of variation in distortion characteristic of the radiofrequency power amplifier with respect to variation in load is compensated for to obtain a good distortion characteristic (ACLR) at an arbitrary output load impedance.

Third Embodiment

Figure 8:
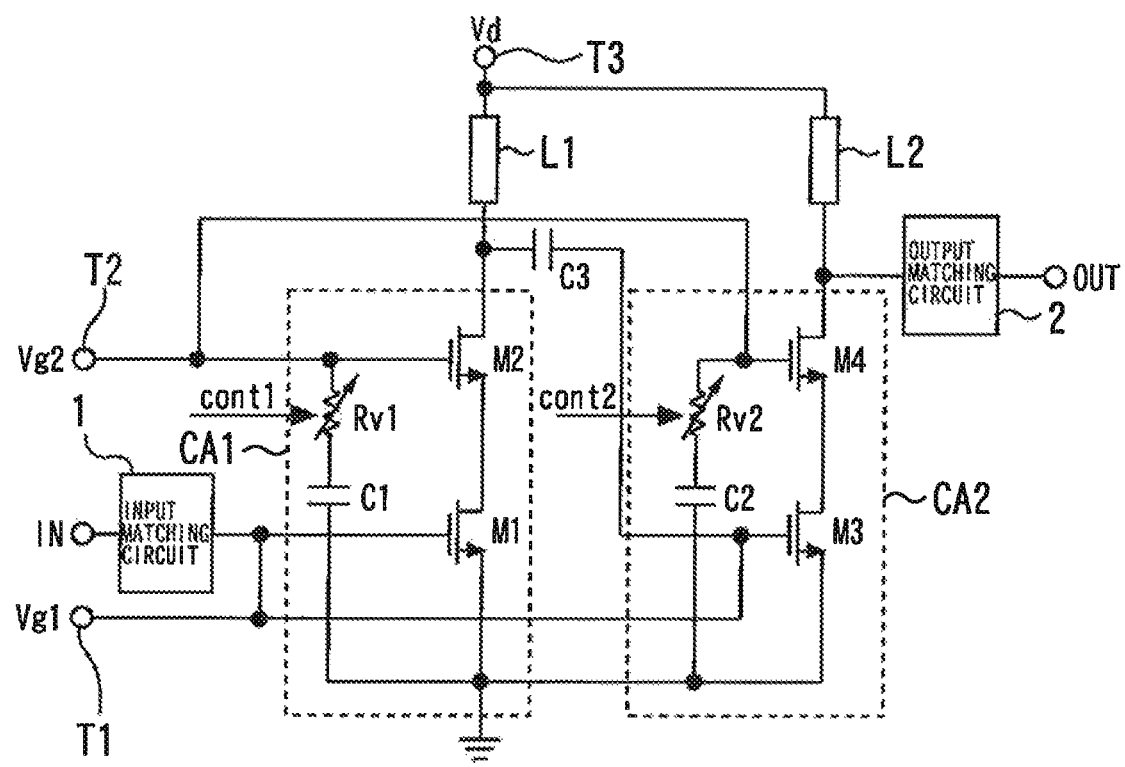
FIG. 8 is a circuit diagram showing a cascode amplifier according to a third embodiment of the present invention.

FIG. 8 is a circuit diagram showing a cascode amplifier according to a third embodiment of the present invention. Cascode amplifiers CA1 and CA2 in two stages are connected to each other. Transistors M1 and M2, a fixed capacitor C1 and a variable resistor Rv1 constitute the cascode amplifier CA1, while transistors M3 and M4, a fixed capacitor C2 and a variable resistor Rv2 constitute the cascode amplifier CA2.

A fixed capacitor C3 is provided between the drain of the transistor M2 and the gate of the transistor M3 so that a drain bias Vd applied to the drain of the transistor M2 is not applied to the gate of the transistor M3.

Figure 9:
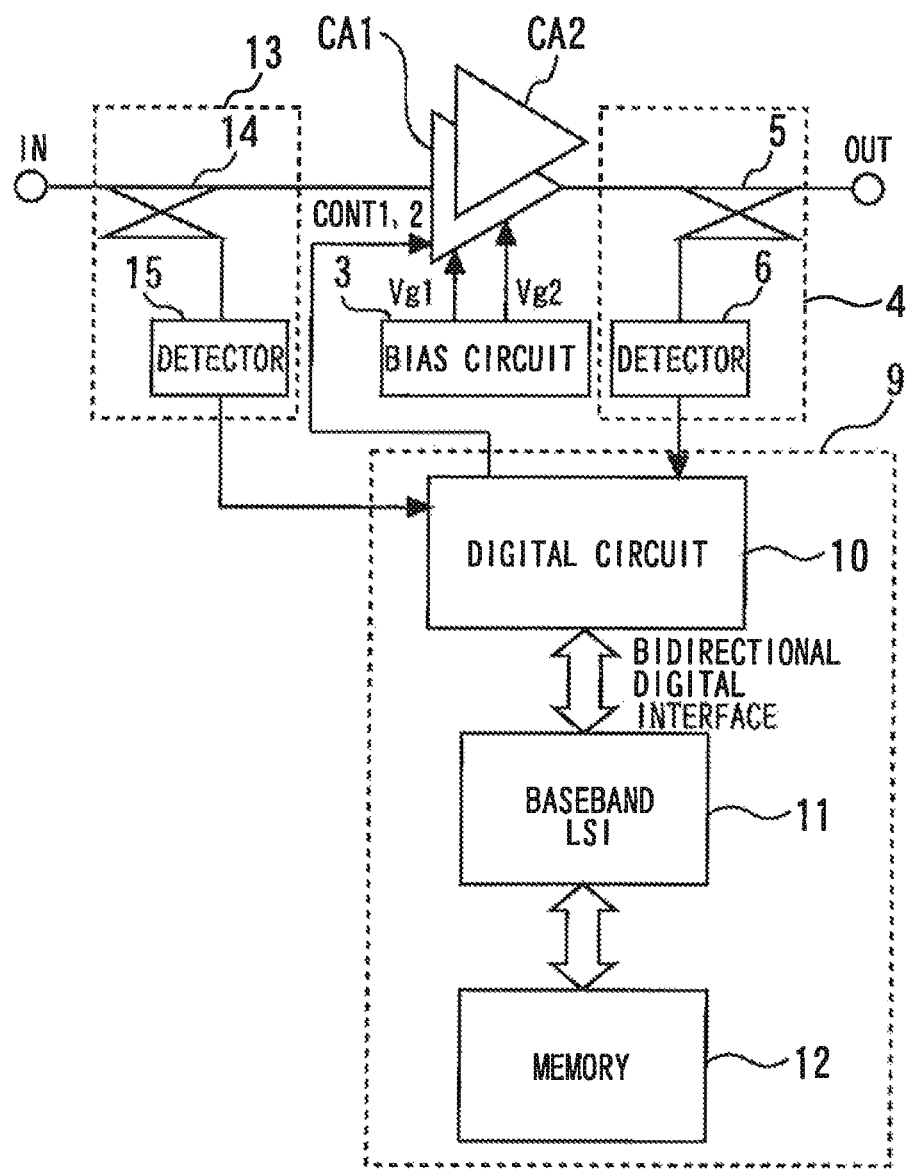
FIG. 9 is a circuit diagram showing a power amplifier according to the third embodiment of the present invention.

FIG. 9 is a circuit diagram showing a power amplifier according to the third embodiment of the present invention. The control circuit 9 outputs control signals cont1 and cont2 such that the AM-AM characteristic of the cascode amplifiers CA1 and CA2 becomes equal to the desired characteristic, and thereby controls the resistance values of the variable resistors Rv1 and Rv2. As a result, the range of adjustment of the AM-AM characteristic (and the AM-PM characteristic) can be extended in comparison with the case where only one cascode amplifier stage is provided. The number of cascode amplifier stages is not limited to two. Three or more cascode amplifier stages may be provided.

Fourth Embodiment

Figure 10:
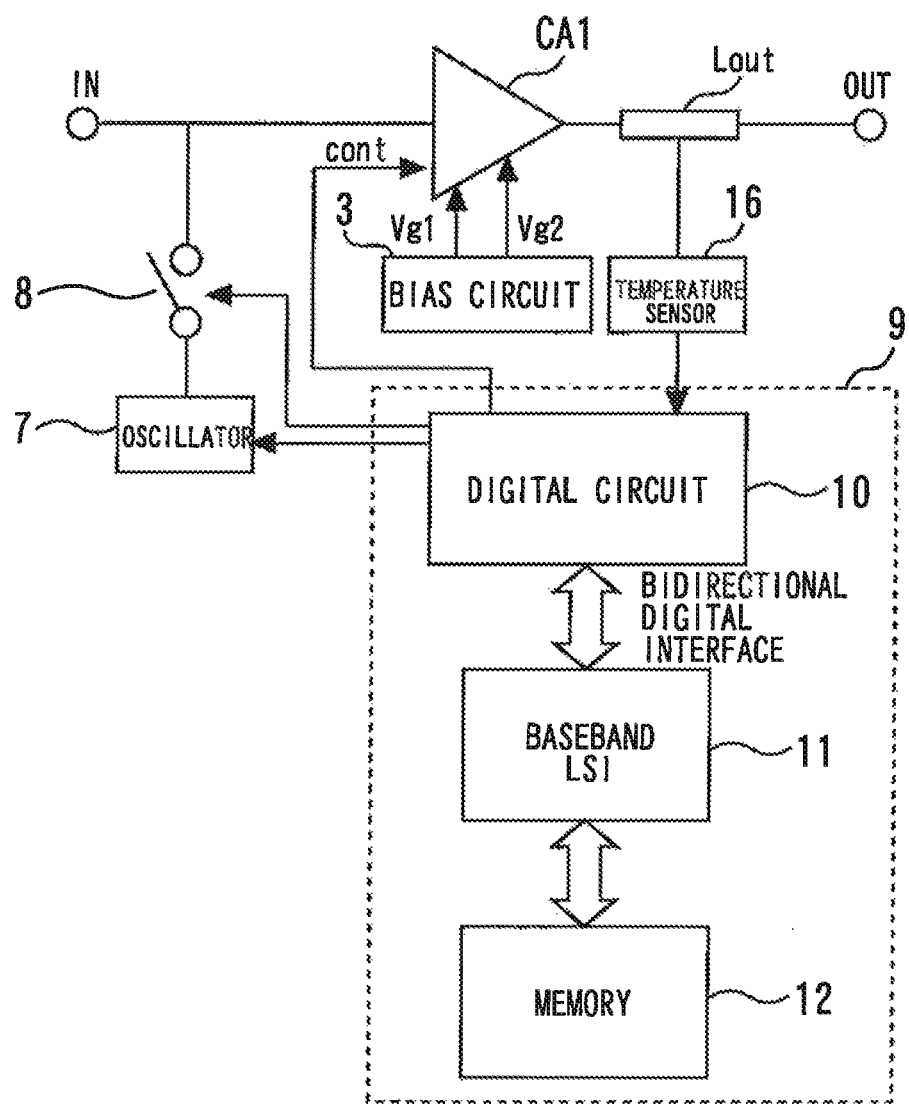
FIG. 10 is a circuit diagram showing a power amplifier according to a fourth embodiment of the present invention.

FIG. 10 is a circuit diagram showing a power amplifier according to a fourth embodiment of the present invention. An output line $L_{OUT}$ is connected to the output of a cascode amplifier CA1. A temperature sensing circuit 16 senses the temperature of the output line $L_{OUT}$. The control circuit 9 controls the resistance value of the variable resistor Rv1 according to the sensed temperature so that the AM-AM characteristic becomes equal to the desired characteristic. More specifically, the digital circuit 10 in the control circuit 9 sets the resistance value of the variable resistor Rv1 to the desired value based on temperature characteristic data set in advance in the memory 12 and the sensed temperature so that the AM-AM characteristic become equal to the desired characteristic with respect to a change in temperature.

Figure 11:
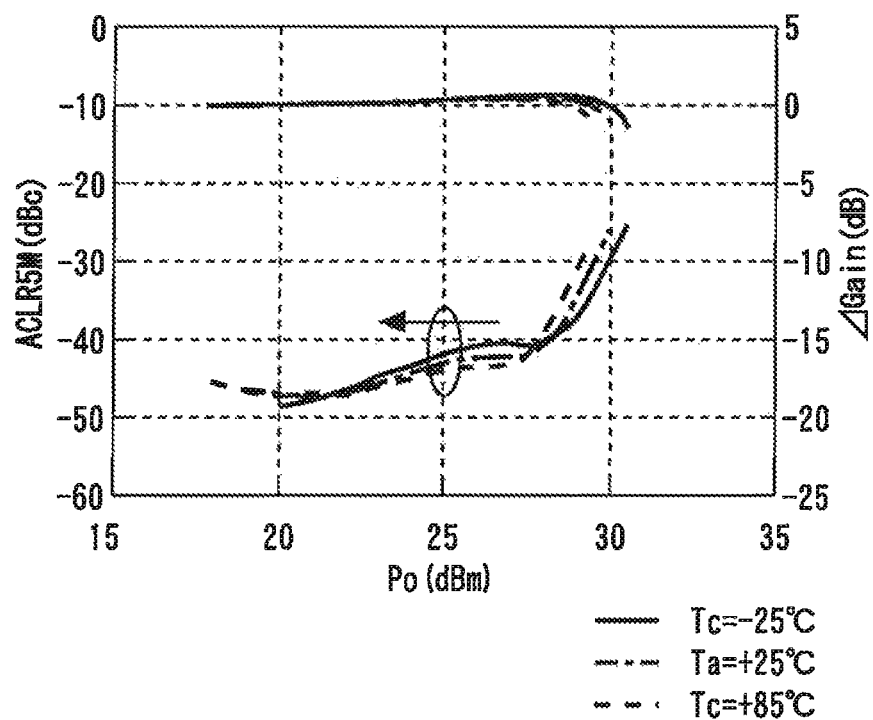
FIG. 11 is a diagram showing the relationship between the gain and a distortion characteristic (ACLR5M) with respect to changes in temperature when the resistance value of the variable resistor is constant.

FIG. 11 is a diagram showing the relationship between the gain and a distortion characteristic (ACLR5M) with respect to changes in temperature when the resistance value of the variable resistor is constant. The gain and the distortion characteristic change with change in temperature. In the present embodiment, therefore, changes in the distortion characteristic with respect to changes in temperature can be suppressed by adjusting the AM-AM characteristic (ΔGain) with respect to the temperature.

Fifth Embodiment

Figure 12:
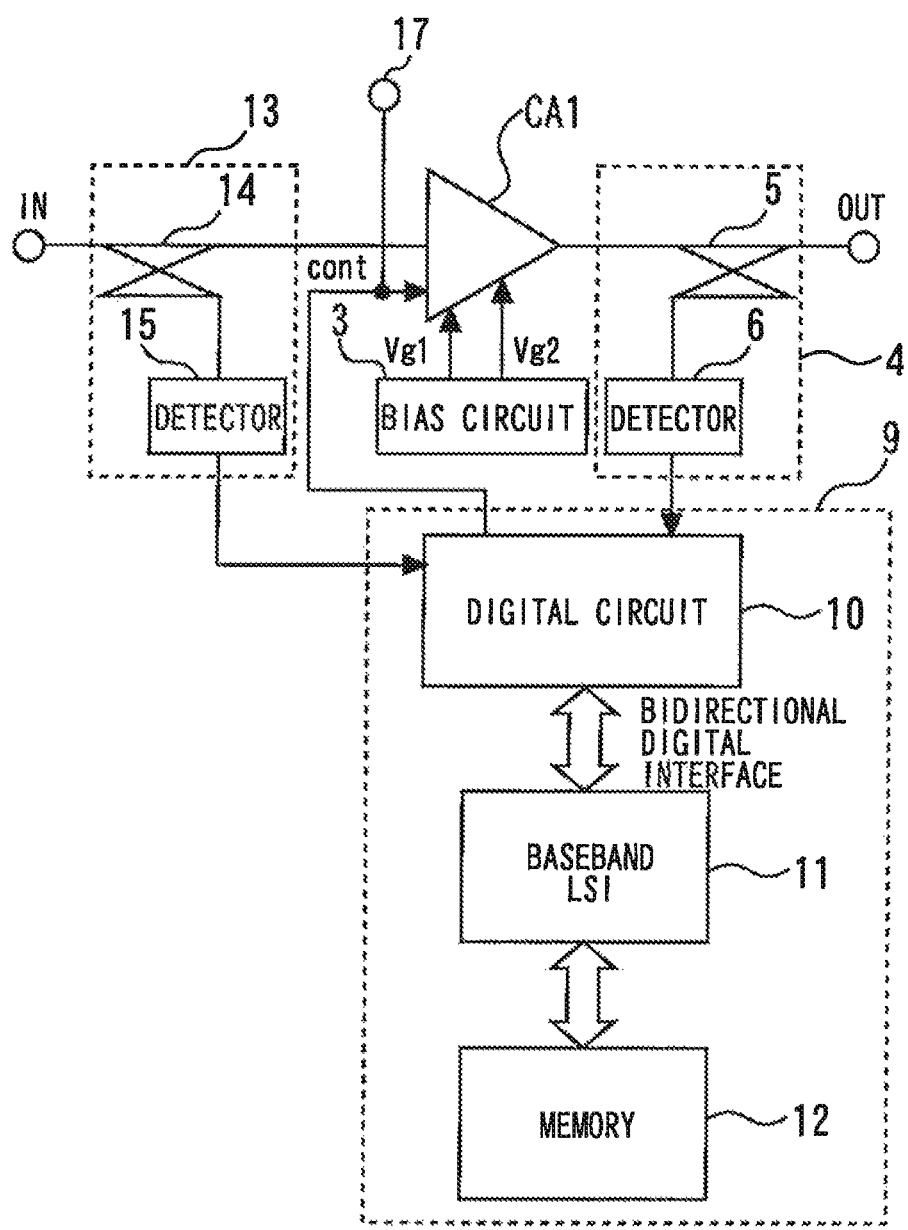
FIG. 12 is a circuit diagram showing a power amplifier according to a fifth embodiment of the present invention.

FIG. 12 is a circuit diagram showing a power amplifier according to a fifth embodiment of the present invention. An external terminal 17 to which a control signal for control of the resistance value of the variable resistor Rv1 is supplied is provided, thereby enabling a user to adjust the AM-AM characteristic (ΔGain) of the radiofrequency power amplifier to the desired value by externally and directly adjusting the resistance value of the variable resistor Rv1 even after mounting the components on a communication device terminal circuit board. Therefore, an optimum distortion characteristic (ACLR) according to a plurality of modulations and circumstances can be obtained. As a result, variations of the radiofrequency power amplifier can be reduced to improve the development efficiency.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-085792, filed on Apr. 16, 2013 including specification, claims, drawings and summary, on which the Convention priority of the present application is based, is incorporated herein by reference in its entirety.

What is claimed is:

1. A power amplifier comprising:
   first and second bias terminals to which bias voltages are respectively supplied;
   a first transistor having a first control terminal connected to the first bias terminal, a first terminal that is grounded, and a second terminal;
   a second transistor having a second control terminal connected to the second bias terminal, a third terminal connected to the second terminal, and a fourth terminal;
   a capacitor and a variable resistor connected in series with the capacitor, wherein the capacitor and the variable resistor connected in series are connected between the second control terminal and the grounding point;
   a control circuit controlling resistance of the variable resistor, wherein
      the first and second transistors, the capacitor, and the variable resistor constitute a cascode amplifier, and
      variation in gain of the cascode amplifier with respect to input power is an AM-AM characteristic of the cascode amplifier;
   an oscillator inputting a test signal to the cascode amplifier; and
   an output power sensing circuit sensing electric power of an output signal output from the cascode amplifier, wherein the control circuit
      obtains the AM-AM characteristic from electric power of the test signal input to the cascode amplifier and the electric power of the output signal output from the cascode amplifier, and
      controls the resistance of the variable resistor so that the AM-AM characteristic becomes equal to a desired characteristic.

2. A power amplifier comprising:
   first and second bias terminals to which bias voltages are respectively supplied;
   a first transistor having a first control terminal connected to the first bias terminal, a first terminal that is grounded, and a second terminal;
   a second transistor having a second control terminal connected to the second bias terminal, a third terminal connected to the second terminal, and a fourth terminal;
   a capacitor and a variable resistor connected in series with the capacitor, wherein the capacitor and the variable resistor connected in series are connected between the second control terminal and the grounding point;
   a control circuit controlling resistance of the variable resistor, wherein
      the first and second transistors, the capacitor, and the variable resistor constitute a cascode amplifier, and
      variation in gain of the cascode amplifier with respect to input power is an AM-AM characteristic of the cascode amplifier;
   an input power sensing circuit sensing electric power of an input signal input to the cascode amplifier; and
   an output power sensing circuit sensing electric power of an output signal output from the cascode amplifier, wherein the control circuit
      obtains the AM-AM characteristic from the electric power of the input signal input to the cascode amplifier and the electric power of the output signal output from the cascode amplifier, and
      controls the resistance of the variable resistor so that the AM-AM characteristic becomes equal to a desired characteristic.

3. The power amplifier according to claim 2, comprising a plurality of the cascode amplifiers connected to each other in a plurality of stages, wherein the control circuit controls the resistances of the variable resistors of the cascode amplifiers such that the AM-AM characteristic of the cascode amplifiers becomes equal to the desired characteristic.

4. The power amplifier according to claim 2, further comprising an external terminal to which a control signal for control of the resistance of the variable resistor is supplied.

5. A power amplifier comprising:
   first and second bias terminals to which bias voltages are respectively supplied;

a first transistor having a first control terminal connected to the first bias terminal, a first terminal that is grounded, and a second terminal;

a second transistor having a second control terminal connected to the second bias terminal, a third terminal connected to the second terminal, and a fourth terminal;

a capacitor and a variable resistor connected in series with the capacitor, wherein the capacitor and the variable resistor connected in series are connected between the second control terminal and the grounding point;

a control circuit controlling resistance of the variable resistor, wherein the first and second transistors, the capacitor, and the variable resistor constitute a cascode amplifier, and variation in gain of the cascode amplifier with respect to input power is an AM-AM characteristic of the cascode amplifier;

an output line connected to an output of the cascode amplifier; and a temperature sensing circuit sensing temperature of the output line, wherein the control circuit controls the resistance of the variable resistor according to the sensed temperature so that the AM-AM characteristic becomes equal to a desired characteristic.

6. The power amplifier according to claim 5, further comprising an oscillator inputting a test signal to the cascode amplifier.

* * * * *